(12) United States Patent
Booth et al.

(10) Patent No.: US 7,521,969 B2
(45) Date of Patent: Apr. 21, 2009

(54) SWITCH SEQUENCING CIRCUIT SYSTEMS AND METHODS

(75) Inventors: Richard Booth, Riegelsville, PA (US); Phillip Johnson, Hellertown, PA (US)

(73) Assignee: Lattice Semiconductor Corporation, Hillsboro, OR (US)

(*) Notice: Subject to any disclaimer, the term of this patent is extended or adjusted under 35 U.S.C. 154(b) by 34 days.

(21) Appl. No.: 11/494,862

(22) Filed: Jul. 28, 2006

(65) Prior Publication Data

US 2008/0024171 A1 Jan. 31, 2008

(51) Int. Cl.
*H03K 19/094* (2006.01)

(52) U.S. Cl. .............................. 326/87; 326/68; 326/97

(58) Field of Classification Search ................. 326/63, 326/38, 68–97; 327/108, 170, 399; 716/16; 318/400.01
See application file for complete search history.

(56) References Cited

U.S. PATENT DOCUMENTS

| | | | |
|---|---|---|---|
| 5,285,116 A * | 2/1994 | Thaik | 326/21 |
| 5,355,036 A * | 10/1994 | Gata | 327/384 |
| 5,514,995 A * | 5/1996 | Hennig | 327/399 |
| 5,563,592 A | 10/1996 | Cliff et al. | |
| 5,754,734 A | 5/1998 | Emeott et al. | |
| 5,768,372 A | 6/1998 | Sung et al. | |
| 5,794,033 A | 8/1998 | Aldebert et al. | |
| 5,825,145 A * | 10/1998 | Pham et al. | 318/400.01 |
| 5,872,529 A | 2/1999 | Mejia | |
| 6,028,445 A | 2/2000 | Lawman | |
| 6,038,185 A | 3/2000 | Ng | |
| 6,044,025 A | 3/2000 | Lawman | |
| 6,327,634 B1 | 12/2001 | Statovici | |
| 6,433,579 B1 * | 8/2002 | Wang et al. | 326/38 |
| 6,483,342 B2 | 11/2002 | Britton et al. | |
| 6,493,862 B1 | 12/2002 | Young et al. | |
| 6,507,214 B1 | 1/2003 | Snyder | |
| 6,507,943 B1 | 1/2003 | Kelem | |
| 6,525,678 B1 | 2/2003 | Veenstra et al. | |
| 6,563,437 B1 | 5/2003 | Landry et al. | |
| 6,564,285 B1 | 5/2003 | Mills | |

(Continued)

OTHER PUBLICATIONS

U.S. Appl. No. 11/494,862, filed Jul. 28, 2006, Booth et al.

(Continued)

*Primary Examiner*—James H. Cho
*Assistant Examiner*—Crystal L Hammond
(74) *Attorney, Agent, or Firm*—Haynes and Boone, LLP

(57) ABSTRACT

Systems and methods are disclosed herein to provide improved I/O techniques. For example, in accordance with an embodiment of the present invention, an integrated circuit includes a driver that receives data signals and provides an output signal based on the data signals, with the driver having a plurality of transistors with a first set of the plurality of transistors adapted to provide a first logical value as the output signal and a second set of the plurality of transistors adapted to provide a second logical value as the output signal based on the data signals. A sequencing circuit provides the data signals to the driver such that the first set of the plurality of transistors is switched on before the second set of the plurality of transistors is switched off, and the second set of the plurality of transistors is switched on before the first set of the plurality of transistors is switched off.

9 Claims, 7 Drawing Sheets

U.S. PATENT DOCUMENTS

| | | |
|---|---|---|
| 6,567,517 B1 | 5/2003 | Weir |
| 6,611,157 B2* | 8/2003 | Usui ........................ 327/112 |
| 6,653,878 B2* | 11/2003 | Nolan ....................... 327/170 |
| 6,744,388 B1 | 6/2004 | Khu |
| 6,772,230 B2 | 8/2004 | Chen et al. |
| 6,785,165 B2 | 8/2004 | Kawahara |
| 6,885,227 B2 | 4/2005 | Agrawal et al. |
| 6,903,574 B2 | 6/2005 | Chen et al. |
| 7,019,577 B2 | 3/2006 | Agrawal et al. |
| 7,034,599 B1 | 4/2006 | Agrawal et al. |
| 7,154,301 B2* | 12/2006 | Levin ........................ 326/86 |
| 7,222,324 B1* | 5/2007 | Kaszynski .................. 716/16 |
| 2004/0061147 A1 | 4/2004 | Fujita |
| 2004/0064622 A1 | 4/2004 | Smith |
| 2005/0024119 A1* | 2/2005 | Coley et al. ................. 327/291 |
| 2006/0114028 A1* | 6/2006 | Lu .............................. 326/83 |
| 2007/0057713 A1* | 3/2007 | Macaluso ................... 327/199 |

OTHER PUBLICATIONS

U.S. Appl. No. 10/809,658, filed Mar. 25, 2004, Tang.
U.S. Appl. No. 11/243,255, filed Oct. 4, 2005, Tang.
U.S. Appl. No. 11/346,817, filed Feb. 3, 2006, Chen et al.
U.S. Appl. No. 11/530,620, filed Sep. 11, 2006, Callahan et al.

* cited by examiner

US 7,521,969 B2

SWITCH SEQUENCING CIRCUIT SYSTEMS AND METHODS

TECHNICAL FIELD

The present invention relates generally to electrical circuits and, more particularly, to switch sequencing circuits directed to reducing noise, for example, in low voltage differential signaling (LVDS) differential output drivers.

BACKGROUND

Input/output (I/O) circuits are generally used for transferring data to and from an integrated circuit or other type of electronic device. I/O circuits (also referred to as input/output buffers, receiver/transmitter circuits, or receiver/driver circuits) are often designed to support one or more types of I/O interface standards (e.g., low voltage differential signaling (LVDS) or high-speed transceiver logic (HSTL)), which may include one or more signal level requirement types within an I/O interface standard (e.g., a specific type of LVDS). These I/O interface standards generally address chip-to-chip interfaces, board-to-board interfaces, and box-to-box interfaces for a wide range of existing and emerging applications, such as data packet processing, data bus bridges, and high-speed memory interfacing.

The I/O circuits typically are designed to support the desired I/O standard, while minimizing noise and other known performance degradations. As a specific example, an LVDS differential output driver may be used to transmit information from one integrated circuit to another. The LVDS differential output driver typically employs switches to direct current in one direction or another to a receiver to transmit the desired information. However, a drawback of a conventional LVDS differential output driver is that the switches may not operate in an identical fashion and may not open and close at precisely the desired time. Consequently, this may result in performance degradation and may also result in noise being introduced at the LVDS differential output driver's output. As a result, there is a need for improved I/O circuit techniques, such as switching techniques for LVDS differential output driver applications.

SUMMARY

In accordance with one embodiment of the present invention, an integrated circuit includes a driver adapted to receive data signals and provide an output signal based on the data signals, wherein the driver comprises a plurality of transistors with a first set of the plurality of transistors adapted to provide a first logical value as the output signal and a second set of the plurality of transistors adapted to provide a second logical value as the output signal based on the data signals; and a sequencing circuit adapted to provide the data signals to the driver, wherein the sequencing circuit provides the data signals such that the first set of the plurality of transistors is switched on before the second set of the plurality of transistors is switched off, and the second set of the plurality of transistors is switched on before the first set of the plurality of transistors is switched off.

In accordance with another embodiment of the present invention, an integrated circuit includes a first and a second switching means adapted to provide a first and a second logical value, respectively, as an output signal from the integrated circuit in response to a first and a second data signal; means for regulating a current through the first and second switching means; and means for sequencing the first and second data signals to switch on the first switching means before switching off the second switching means to provide the first logical value as the output signal, and to switch on the second switching means before switching off the first switching means to provide the second logical value as the output signal.

In accordance with another embodiment of the present invention, a method of providing an output signal includes providing a first set of switches to steer a current through a load in a first direction to provide a first logical value as the output signal; providing a second set of switches to steer a current through a load in a second direction to provide a second logical value as the output signal; and providing a first and a second signal to the first set and second set of switches, respectively, wherein the first signal switches on the first set of switches before the second signal switches off the second set of switches to provide the first logical value, and the second signal switches on the second set of switches before the first signal switches off the first set of switches to provide the second logical value.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
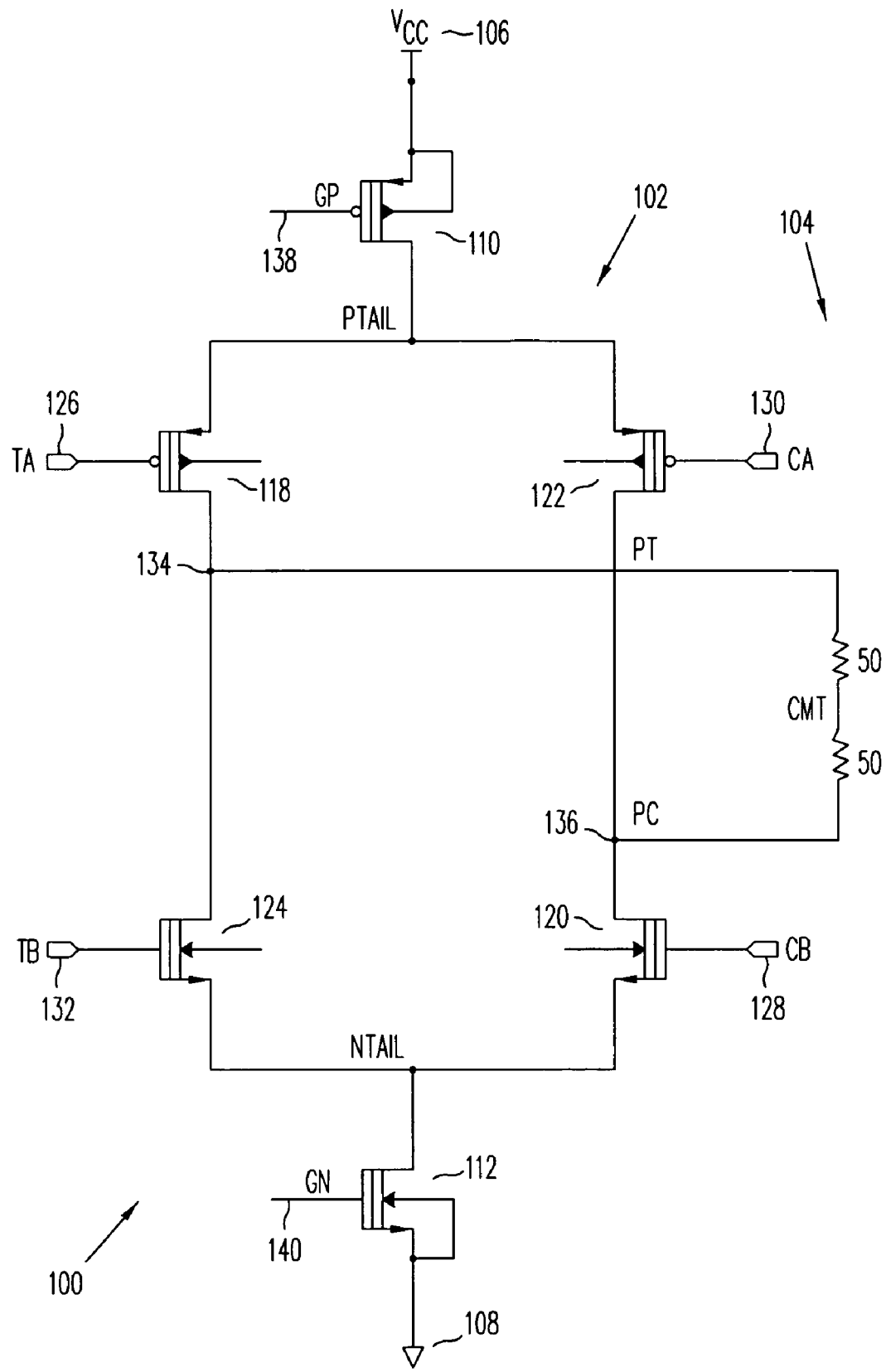
FIG. 1 shows a block diagram illustrating an input/output interface with an LVDS differential output driver in accordance with an embodiment of the present invention.

FIG. 1 shows a block diagram of a system 100 illustrating a portion of an input/output interface for low voltage differential signaling (LVDS) in accordance with an embodiment of the present invention. System 100 includes an LVDS differential output driver 102 for providing information to a load 104 (e.g., two 50 ohm resistors) of a receiver (i.e., a portion of the receiver with only the load portion shown).

LVDS differential output driver 102 (also referred to as a high-speed LVDS output driver cell) includes current source transistors 110 and 112 and switching transistors 118, 120, 122, and 124. LVDS differential output driver 102 is coupled to a supply voltage line 106 (to provide a supply voltage Vcc) and a reference voltage line 108 (e.g., for a ground or other reference voltage). Transistors 112, 120, and 124 may be implemented as n-channel MOSFETs, with their gates provided with corresponding signals 140, 128, and 132 (labeled GN, CB, and TB, respectively). Transistors 110, 118, and 122 may be implemented as p-channel MOSFETs, with their gates provided with corresponding signals 138, 126, and 130 (labeled GP, TA, and CA, respectively).

Signals 138 and 140 provide the desired biasing of transistors 110 and 112, while signals 126, 128, 130, and 132 provide the appropriate logic levels to transistors 118, 120, 122, and 124 for driving current through load 104 (e.g., a 100 ohm resistor) via output terminals 134 and 136 (labeled PT and PC, respectively). For example, when LVDS differential output driver 102 provides a logical high (e.g., a "1" state), current is directed from output terminal 134 (PT), through load 104, and to output terminal 136 (PC), with transistors 118 and 120 switched on and transistors 122 and 124 switched off. When LVDS differential output driver 102 provides a logical low (e.g., a "0" state), current is directed from output terminal 136 (PC), through load 104, and to output terminal 134 (PT), with transistors 122 and 124 switched on and transistors 118 and 120 switched off.

Thus, transistors 118 and 120 are switched on when transistors 122 and 124 are switched off and vice versa based on signals 126, 128, 130, and 132, depending upon the desired logical value (i.e., signal current) to be provided to load 104 of the receiver device. Signals 126 and 128 and 130 and 132, for controlling corresponding transistor pairs 118 and 120 and 122 and 124, are commonly identically timed so that as one pair of transistors are switched on and another pair of transistors are switched off, which would ideally cause no net current change flowing through LVDS differential output driver 102.

However in general, transistors 118, 120, 122, and 124 may not switch on and off at exactly the desired time (e.g., due to different bias points). Consequently, there may be a point in the switching transient when the current is interrupted on one or both sides of LVDS differential output driver 102. This interruption may cause transistors 110 and 112 (the current source transistors) to enter the triode region of operation, which may degrade performance and introduce undesirable noise in the output. For example, transistors 110 and 112 operating in the triode region may pass more noise from the power supply (e.g., supply voltage Vcc) to output terminals 134 and 136 (the output stage) and may require a significant change in drain to source bias to recover.

Figure 2:
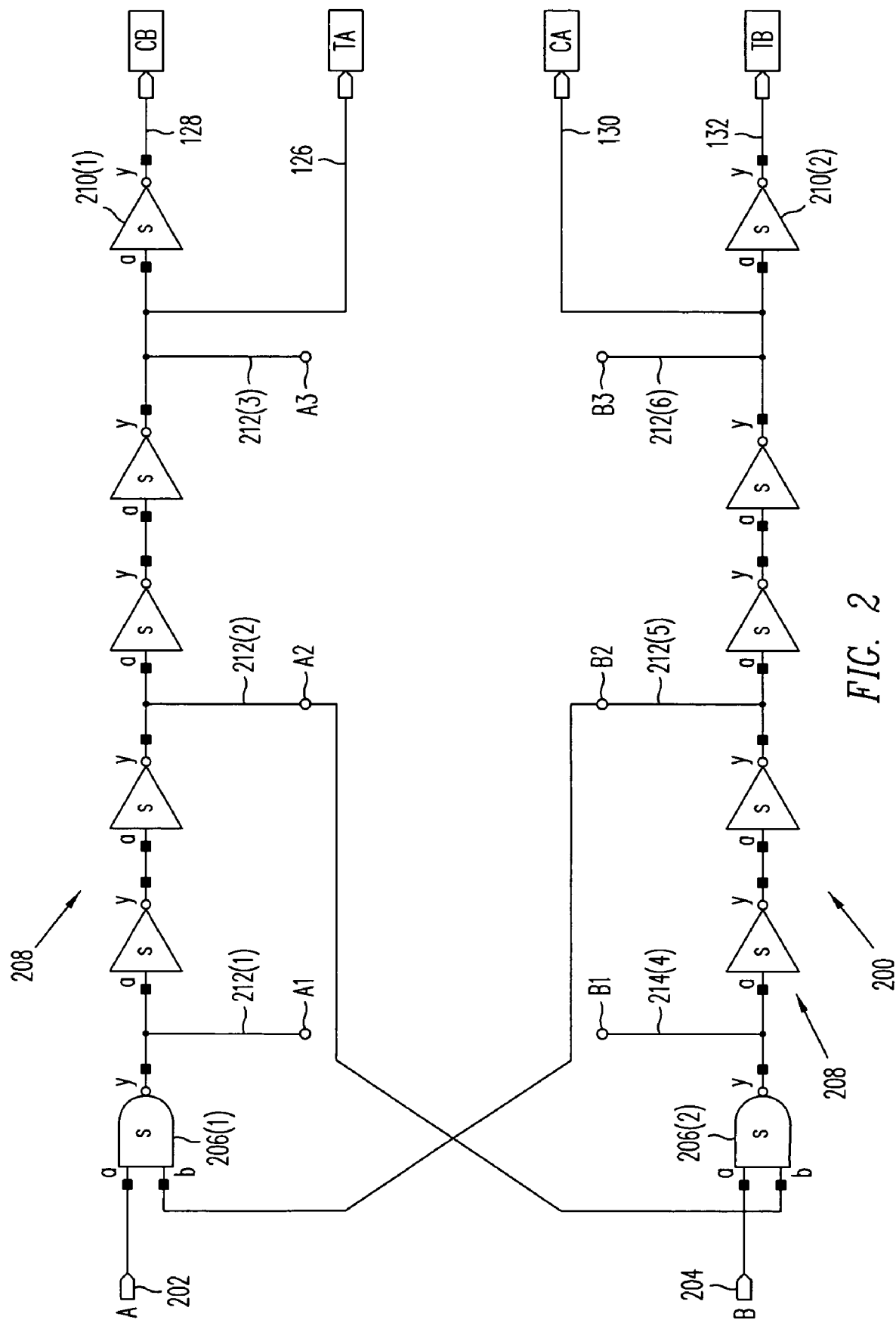
FIG. 2 shows a block diagram illustrating a circuit for providing signals for an LVDS differential output driver in accordance with an embodiment of the present invention.

In accordance with an embodiment of the present invention, techniques are disclosed to sequence the switching within LVDS differential output driver 102 to reduce the switching disturbance and intrinsic noise resulting from the switching. For example, FIG. 2 shows a block diagram illustrating a circuit 200 for providing signals 126, 128, 130, and 132 for LVDS differential output driver 102 in accordance with an embodiment of the present invention.

Circuit 200 receives signals 202 and 204 (e.g., complementary data signals labeled A and B, respectively) and provides signals 126, 128, 130, and 132 (TA, CB, CA, and TB, respectively) to properly sequence the opening and closing of transistors 118, 120, 122, and 124 such that LVDS differential output driver 102 is minimally disturbed and the intrinsic noise caused by the switching is reduced. Specifically, the switching of transistors 118, 120, 122, and 124 is deliberately sequenced as make before break on each side of LVDS differential output driver 102 so that the current is never interrupted and transistors 110 and 112 (the current source devices) stay in saturation to reduce the intrinsic noise produced by switching the output cell.

Circuit 200 includes logic gates 206 (e.g., separately referenced NAND gates 206(1) and 206(2)), inverters 208, and inverters 210(1) and 210(2). Inverters 210(1) and 210(2) provide the desired polarity and relative delay between signals 126 and 128 and between signals 130 and 132. The amount of phase offset can be controlled by increasing or decreasing the number of inverters 208 (e.g., delay gates) between the output of one logic gate 206 (e.g., logic gate 206(1)) and the input to the opposite logic gate 206 (e.g., logic gate 206(2)).

Specifically for example, changing the connections in circuit 200 from a terminal 212(2) (labeled A2) to a terminal 212(3) (labeled A3) and from a terminal 212(5) (labeled B2) to a terminal 212(6) (labeled B3) increases the phase-offset, while changing from terminal 212(2) to a terminal 212(1) (labeled A1) and from terminal 212(5) to a terminal 212(4) (labeled B1) decreases the phase-offset. The connections in circuit 200 for terminals 212 may be programmable if circuit 200 is incorporated within a programmable logic device, as discussed further herein, in accordance with an embodiment of the present invention.

For example, if signals 202 and 204 transition to a logical low and a logical high, respectively, then signals 130 and 132 provide logical values to switch transistors 122 and 124 on before signals 126 and 128 provide logical values to switch transistors 118 and 120 off. Similarly, if signals 202 and 204 transition to a logical high and a logical low, respectively, then signals 126 and 128 provide logical values to switch transistors 118 and 120 on before signals 130 and 132 provide logical values to switch transistors 122 and 124 off.

By providing signals 126, 128, 130, and 132 to LVDS differential output driver 102 as discussed in reference to FIG. 2, circuit 200 may provide certain performance improvements over conventional LVDS differential output drivers. For example, FIGS. 3 and 4 show graphs illustrating simulation results for system 100 of FIG. 1 in accordance with an embodiment of the present invention.

Figure 3:
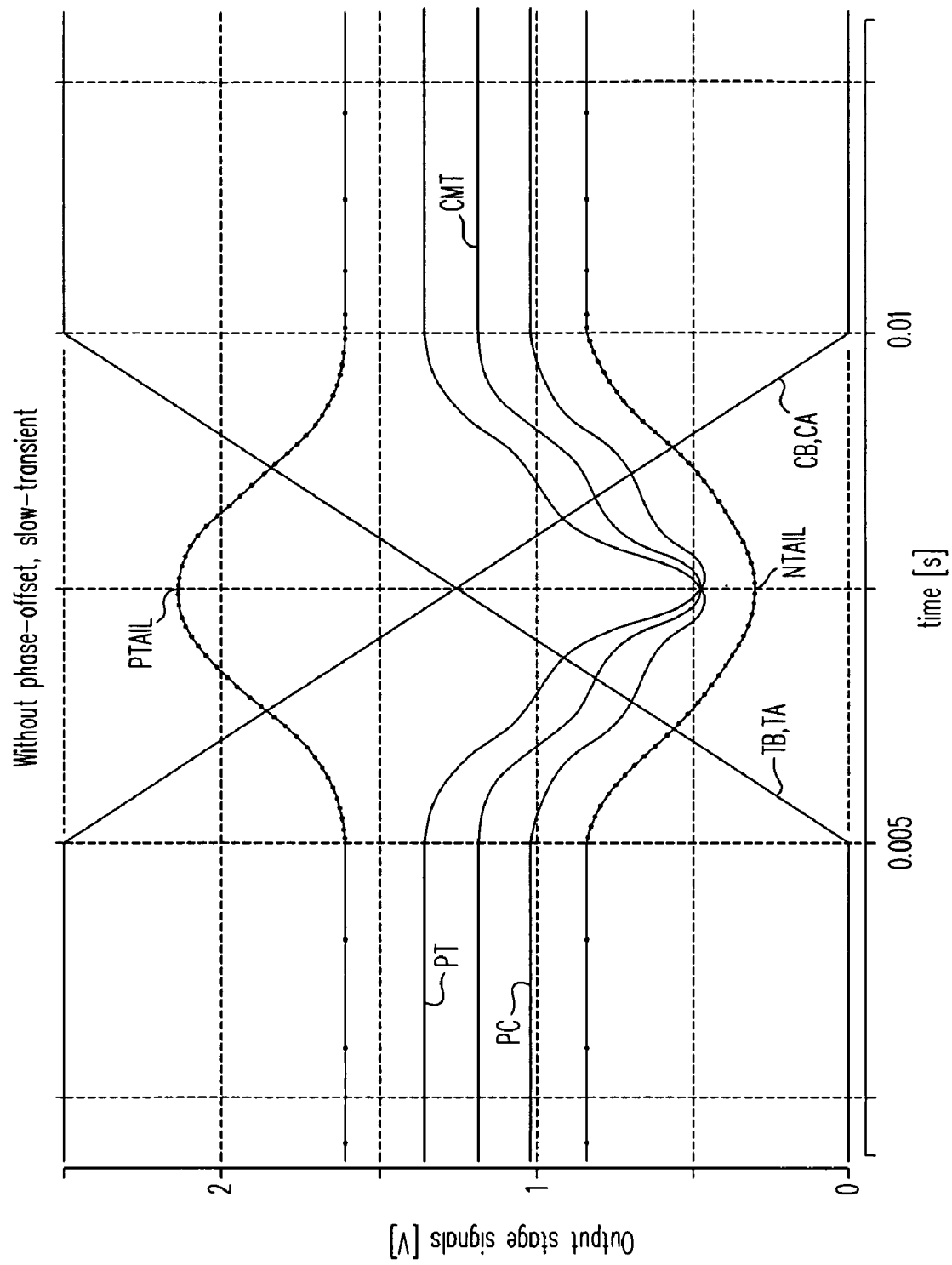
FIG. 3 shows a graph illustrating simulation results for the LVDS differential output driver of FIG. 1.

Specifically, FIG. 3 is a transient simulation result for the case when signals 126 and 132, used to switch transistor 118 off and transistor 124 on, respectively, are identically phased (labeled TB, TA in FIG. 3, with FIG. 3 representing a slow-transient simulation without switching phase offset employed for system 100). Similarly, signals 130 and 128, used to switch transistor 122 on and transistor 120 off, respectively, are identically phased (labeled CB, CA in FIG. 3).

As shown in FIG. 3, the drain voltages of transistors 110 and 112 (labeled PTAIL and NTAIL, respectively, in FIG. 3) are driven to larger and smaller values, respectively, during the course of the transient. Consequently, transistors 110 and 112, which are intended to operate as current sources, are significantly disturbed and driven into their respective triode regions of operation due to the current being interrupted during the switching transient. Additionally, note that the output signals (labeled PT and PC in FIG. 3) provided by output terminals 134 and 136 are significantly warped during the course of the switching transient. Because the output signals are taken as a differential pair, the output remains intact. However, the common mode of the output pair (labeled CMT in FIG. 3), for this example, drops well below the 1.2V nominal value. Furthermore, note that the output signals (PT and PC), as well as the signals labeled PTAIL and NTAIL in FIG. 3, change during the entire course of the switching transient (e.g., in the 5 to 10 millisecond time frame).

Figure 4:
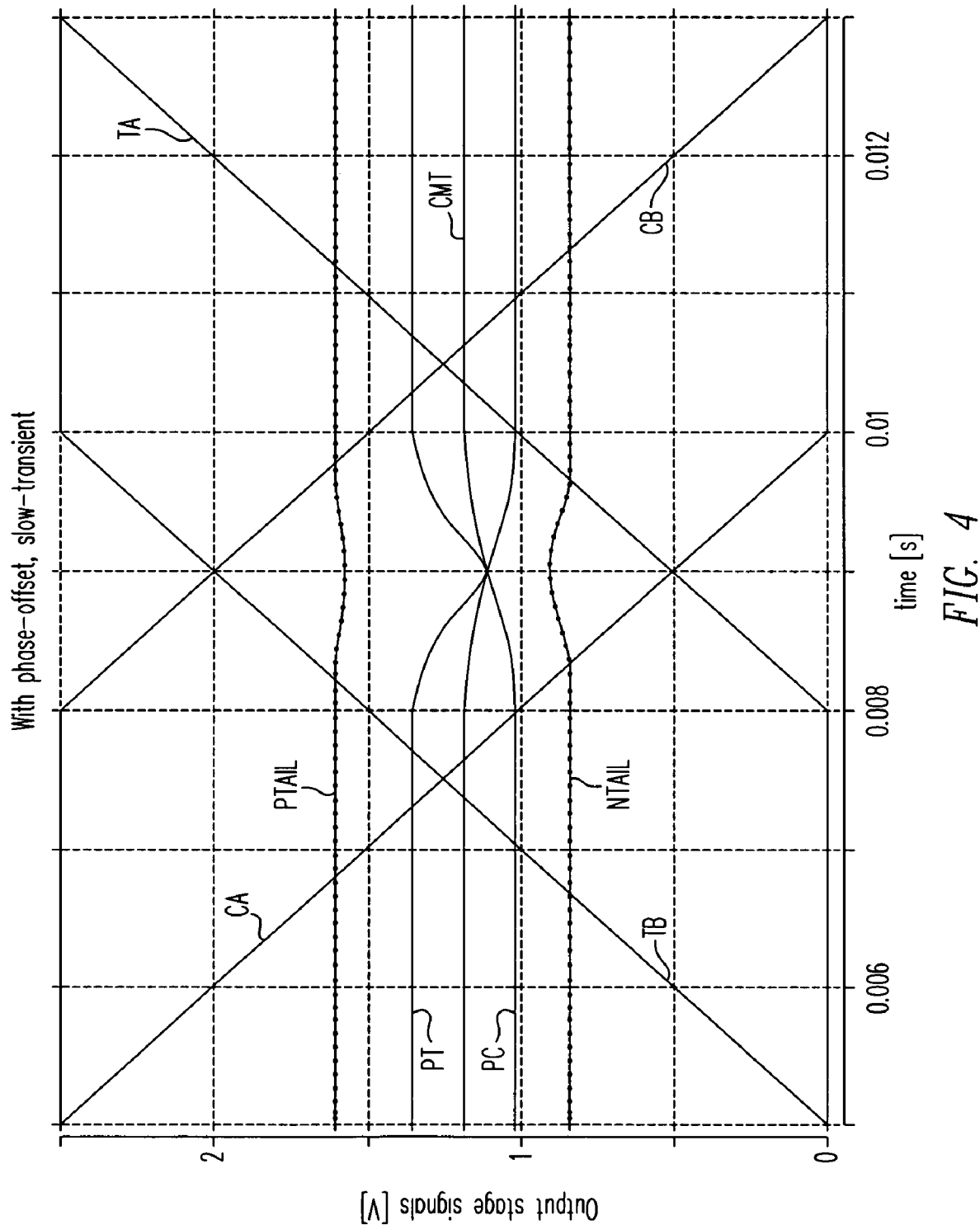
FIG. 4 shows a graph illustrating simulation results for the LVDS differential output driver of FIG. 1 in accordance with an embodiment of the present invention.

FIG. 4 shows a slow transient simulation for the case when signals 126, 128, 130, and 132 (the switching signals) are phased such that current is never interrupted within LVDS differential output driver 102 (e.g., slow-transient simulation with switching phase offset employed for system 100). In other words, the two transistors which are off in a particular state (e.g., transistors 122 and 124) are switched on first before switching the opposite transistors off (e.g., transistors 118 and 120).

As shown in FIG. 4, signals 132 and 130 (labeled TB and CA, respectively, in FIG. 4)) transition first, which switches on transistors 124 and 122, respectively, while transistors 118 and 120 remain switched on. Next, signals 126 and 128 (labeled TA and CB, respectively, in FIG. 4) transition and switch off transistors 118 and 120. Note for this example with phase-offset applied (e.g., as discussed in reference to FIG. 2 by employing circuit 200 of FIG. 2), the tail voltages NTAIL and PTAIL are only mildly disturbed, relative to FIG. 3, and vary such that the respective devices (transistors 112 and 110) move further into saturation. Furthermore, the output voltages (labeled PT and PC) of output terminals 134 and 136 are not warped, as in FIG. 3, and the common mode voltage (CMT) for output terminals 134 and 136 does not vary to any substantial degree from the nominal 1.2V value.

It should also be noted that transistors 118, 120, 122, and 124 (the switching devices) change state only when the phased input signals overlap (e.g., 8 to 10 millisecond time frame). Thus, the switching in FIG. 4 occurs in a smaller amount of time, with significantly less disturbance to the output cell, relative to FIG. 3. Additionally, the signal swing of the differential signal pair (PT/PC) on output terminals 134/136 is reduced during the time when transistors 118, 120, 122, and 124 are switched on, because current is diverted from load 104 directly through transistors 118, 120, 122, and 124 and through transistors 110 and 112 (the tail current sources). Thus, this reduced signal swing aids the switching between a logical high and low (i.e., between a state 1 and 0), similar to the effect of pre-emphasis in driver circuits, wherein the signal swing is reduced after several consecutive ones or zeros in order to aid the ultimate change to the opposite state. In general, the simulation results described in reference to FIG. 4 demonstrate the noise improvement which is possible if the input signals (signals 126, 128, 130, and 132) are phased appropriately.

Figure 5:
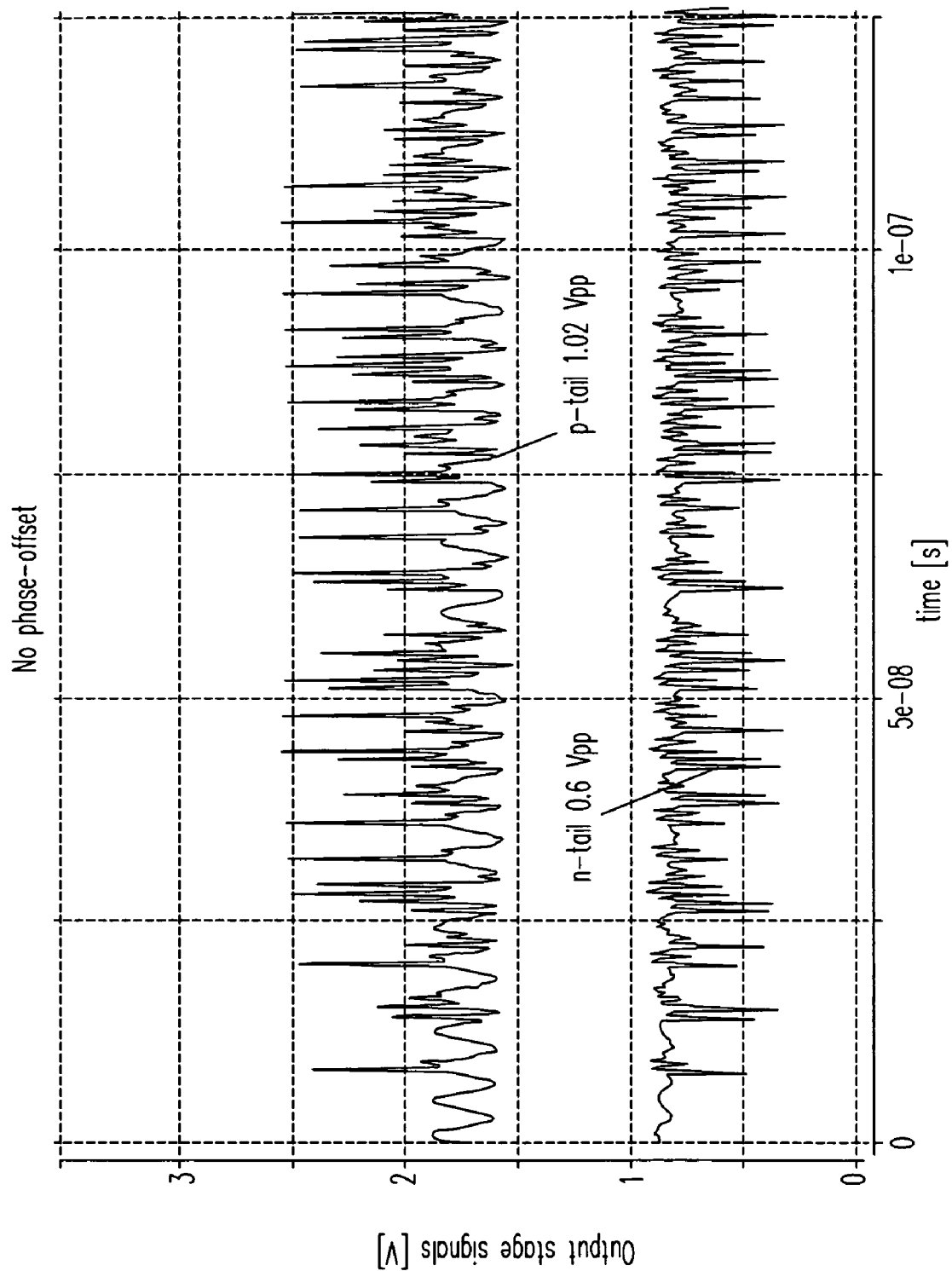
FIG. 5 shows a graph illustrating simulation results for the LVDS differential output driver of FIG. 1.
Figure 6:
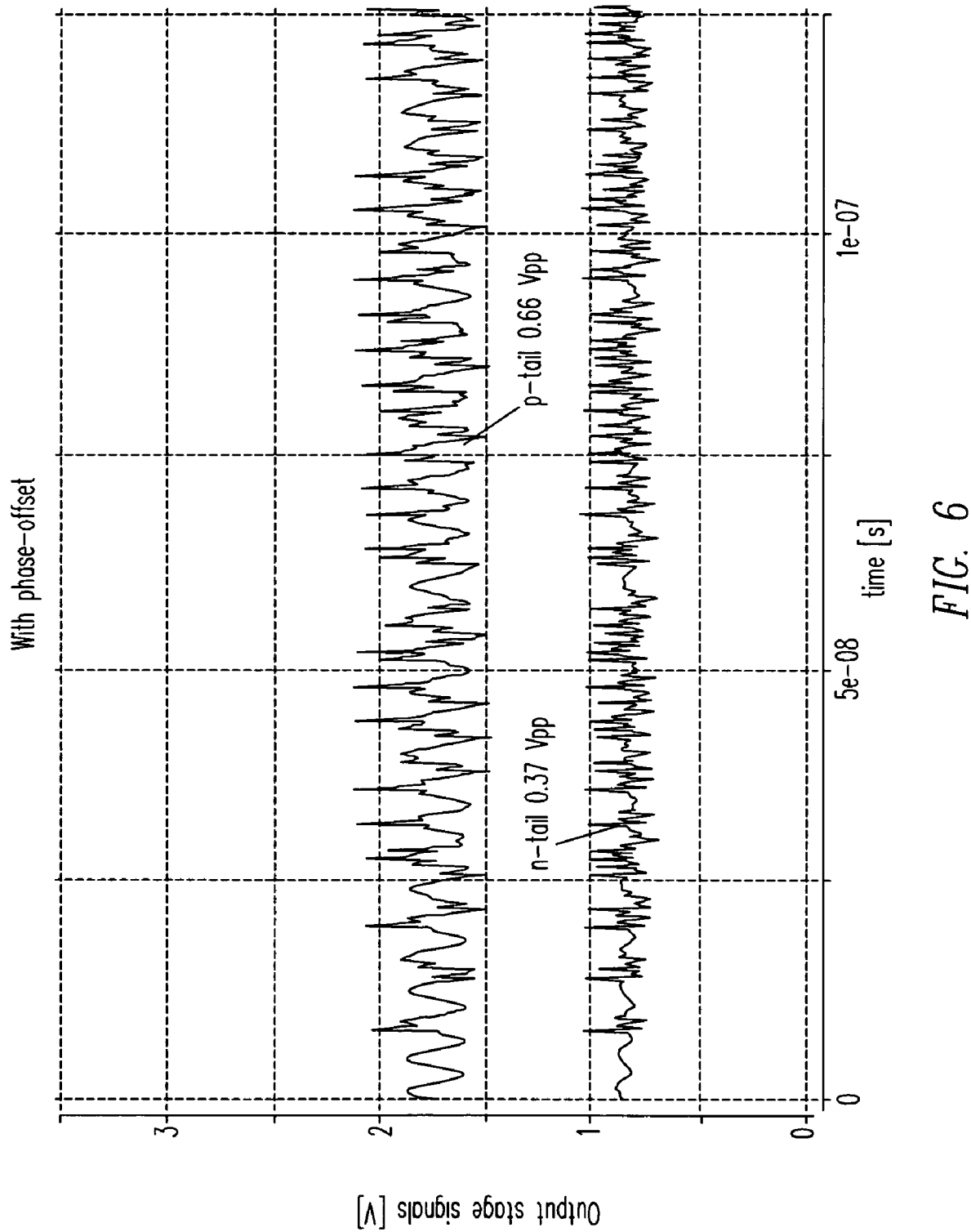
FIG. 6 shows a graph illustrating simulation results for the LVDS differential output driver of FIG. 1 in accordance with an embodiment of the present invention.

FIGS. 5 and 6 show graphs illustrating simulation results for system 100 of FIG. 1 in accordance with an embodiment of the present invention. Specifically, FIGS. 5 and 6 illustrate the performance of system 100 in a fast-transient simulation without and with, respectively, switching phase offset employed.

For these simulations, a noise tone was introduced to a power supply (e.g., supply voltage Vcc) of LVDS differential output driver 102 and the tail voltages labeled NTAIL and PTAIL (e.g., drain voltages of transistors 112 and 110, respectively) were plotted. FIG. 5 shows the transient simulation results for the tail voltages NTAIL and PTAIL without phasing for signals 126, 128, 130, and 132 (the switching signals). As shown, the peak-to-peak intrinsic noise generated by the switching transient is 0.6V on NTAIL and 1.02V on PTAIL. FIG. 6 shows the transient simulation result for the tail voltages NTAIL and PTAIL with phasing for signals 126, 128, 130, and 132 (the switching signals). Relative to FIG. 5, FIG. 6 shows that the peak-to-peak noise introduced by the switching signals is reduced to 0.37V on NTAIL and 0.66V on PTAIL.

It should be understood that circuit 200 may be viewed as representing a switch sequencing circuit, for example, for reducing noise in an LVDS differential output driver or other type of I/O circuit. Thus, the techniques disclosed herein are not limited to LVDS differential output driver circuits and may be applied, as would be understood by one skilled in the art, to other types of I/O circuits. Furthermore, the techniques disclosed herein may be applied to integrated circuits and other types of devices that require I/O interfaces or signal transmission.

Figure 7:
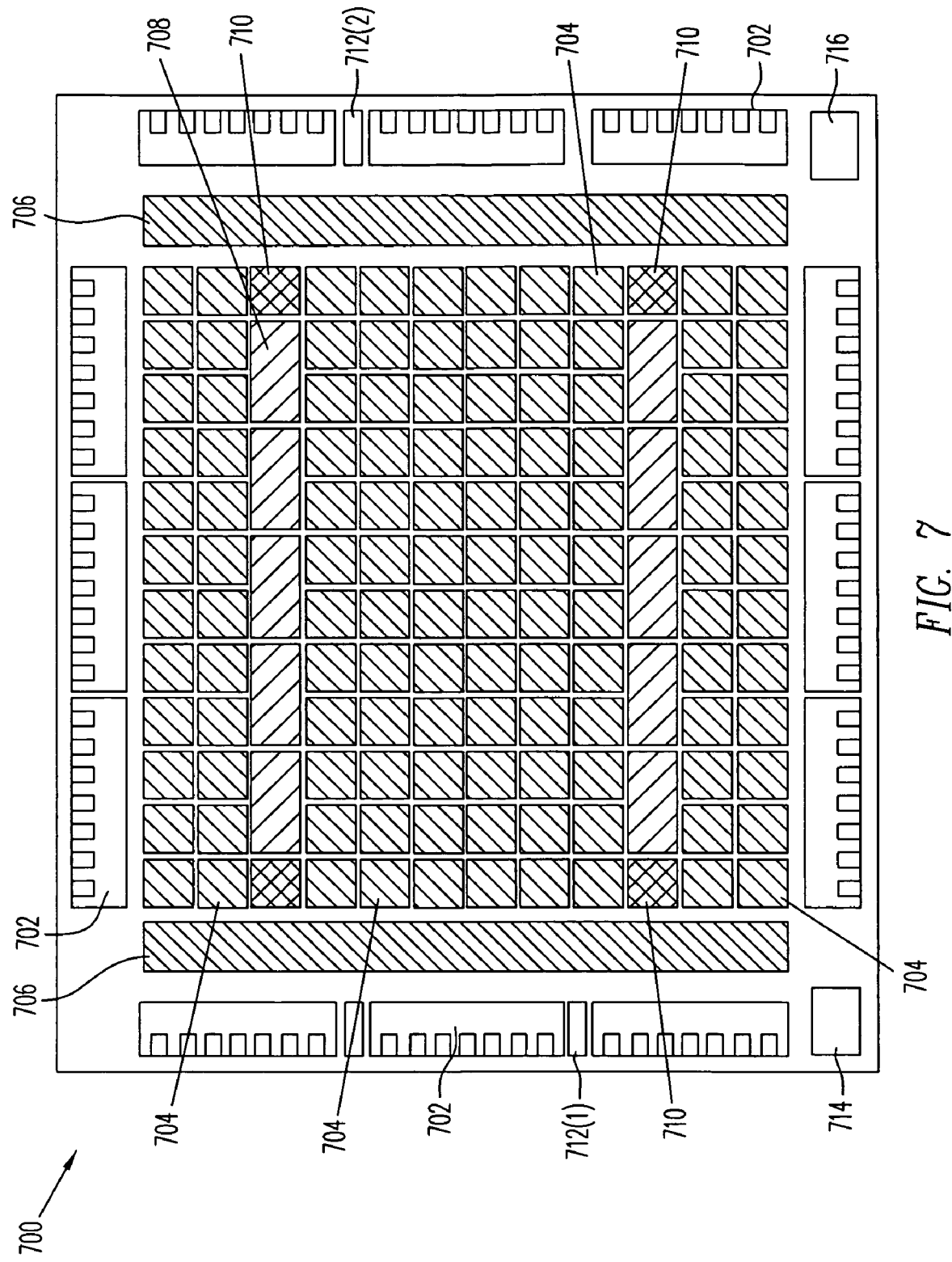
FIG. 7 shows a block diagram illustrating an exemplary programmable logic device in accordance with an embodiment of the present invention.

As an example, FIG. 7 shows a block diagram illustrating an exemplary programmable logic device 700 in accordance with an embodiment of the present invention that may benefit from the techniques disclosed herein. PLD 700 (e.g., a field programmable gate array (FPGA) or a complex programmable logic device (CPLD)) includes input/output (I/O) blocks 702 and programmable logic blocks 704. Programmable logic blocks 704 provide logic functionality (e.g., LUT-based logic and optionally register, arithmetic, and/or memory functionality) for PLD 700. I/O blocks 702 provide I/O functionality (e.g., supports one or more I/O and/or memory interface standards) for PLD 700 and may incorporate, for example, one or more circuits 200 to provide appropriate signal phasing as discussed herein.

PLD 700 may also include reprogrammable non-volatile memory 706 (e.g., blocks of EEPROM or flash memory), volatile memory 708 (e.g., block SRAM), clock-related circuitry 710 (e.g., PLL circuits), one or more data ports 712, configuration memory 714, and/or an interconnect 716. It should be understood that the number and placement of the various elements, such as I/O blocks 702, logic blocks 704, non-volatile memory 706, volatile memory 708, clock-related circuitry 710, data port 712, configuration memory 714, and interconnect 716, is not limiting and may depend upon the desired application. Furthermore, it should be understood that the elements are illustrated in block form for clarity and that certain elements, such as configuration memory 714 and interconnect 716, would typically be distributed throughout PLD 700, such as in and between programmable logic blocks 704, to perform their conventional functions (e.g., storing configuration data that configures PLD 700 and providing routing resources, respectively).

Data port 712 may be used for programming non-volatile memory 706 and/or configuration memory 714 of PLD 700. For example, data port 712(1) may represent a programming port such as a central processing unit (CPU) port, also referred to as a peripheral data port or a sysCONFIG programming port. Data port 712(2) may represent, for example, a programming port such as a joint test action group (JTAG) port by employing standards such as Institute of Electrical and Electronics Engineers (IEEE) 1149.1 or 1532 standards. Data ports 712(1) and 712(2) are not both required, but one or the other or both may be included to receive configuration data and commands.

Systems and methods are disclosed herein to provide improved I/O techniques. For example, in accordance with an embodiment of the present invention, a switch sequencing circuit is disclosed for a LVDS differential output driver to condition the switching signals to improve LVDS differential output driver performance and reduce the potential of noise being introduced at its output. These techniques may be applied to a wide range of I/O circuit types within various types of electrical devices in accordance with one or more embodiments of the present invention.

Embodiments described above illustrate but do not limit the invention. It should also be understood that numerous modifications and variations are possible in accordance with the principles of the present invention. Accordingly, the scope of the invention is defined only by the following claims.

What is claimed is:

1. An integrated circuit comprising:

a driver adapted to receive data signals and provide an output signal based on the data signals, wherein the driver comprises a plurality of transistors with a first set of the plurality of transistors adapted to provide a first logical value as the output signal and a second set of the plurality of transistors adapted to provide a second logical value as the output signal based on the data signals; and a sequencing circuit adapted to provide the data signals to the driver, wherein the sequencing circuit provides the data signals with a selectable timing difference such that the first set of the plurality of transistors is switched on before the second set of the plurality of transistors is switched off, and the second set of the plurality of transistors is switched on before the first set of the plurality of transistors is switched off, wherein the sequencing circuit further comprises:

a logic circuit adapted to receive a first complementary data signal, wherein the logic circuit comprises a first and a second logic gate; and a plurality of delay elements coupled to the logic circuit and adapted to provide the data signals as a second and third complementary data signal based on the first complementary data signal.

2. The integrated circuit of claim 1, wherein the driver comprises a low voltage differential signaling differential output driver.

3. The integrated circuit of claim 1, wherein the driver comprises a low voltage differential signaling differential output driver, and wherein the sequencing circuit receives a first complementary data signal and provides the data signals as a second complementary data signal and a third complementary data signal, with the second complementary data signal provided to the first set of the plurality of transistors and the third complementary data signal provided to the second set of the plurality of transistors.

4. The integrated circuit of claim 1, wherein the driver comprises a low voltage differential signaling differential output driver, and wherein the driver further comprises a first and second current source transistor, with the first current source transistor coupled to a supply voltage line and the plurality of transistors and the second current source transistor coupled to a ground reference line and the plurality of transistors, wherein the plurality of transistors are disposed between the first and second current source transistors.

5. The integrated circuit of claim 4, wherein the first and second current source transistors are adapted to be biased to control current flow through the driver, and wherein the sequencing circuit provides the data signals to the driver such that the first and second set of the plurality of transistors does not reduce the current flow between the first and second current source transistors below a value set when either the first or second set of the plurality of transistors are switched on.

6. The integrated circuit of claim 4, wherein the sequencing circuit provides the data signals to the driver such that the first and second current source transistors remain in their saturation regions.

7. The integrated circuit of claim 1, wherein the first and second logic gates receive as an input signal a corresponding feedback signal from the delay elements, with the feedback signals adjusting a phase offset between the second and third complementary data signals.

8. The integrated circuit of claim 1, wherein the integrated circuit is a programmable logic device further comprising:

a plurality of programmable logic blocks;

configuration memory adapted to store configuration data to configure the programmable logic blocks;

a volatile memory block adapted to store information during operation of the programmable logic device;

a non-volatile memory block adapted to store configuration data for transfer to the configuration memory to configure the programmable logic blocks;

input/output blocks adapted to transfer information into and out of the programmable logic device, wherein at least one of the input/output blocks incorporates the driver and the sequencing circuit; and an interconnect configured based on the configuration data stored in the configuration memory and adapted to provide routing resources between the volatile memory block, input/output blocks, and the programmable logic blocks.

9. An integrated circuit comprising:

a driver adapted to receive data signals and provide an output signal based on the data signals, wherein the driver comprises a plurality of transistors with a first set of the plurality of transistors adapted to provide a first logical value as the output signal and a second set of the plurality of transistors adapted to provide a second logical value as the output signal based on the data signals; and a sequencing circuit adapted to provide the data signals to the driver, wherein the sequencing circuit provides the data signals such that the first set of the plurality of transistors is switched on before the second set of the plurality of transistors is switched off, and the second set of the plurality of transistors is switched on before the first set of the plurality of transistors is switched off, wherein the sequencing circuit further comprises:

a logic circuit adapted to receive a first complementary data signal, wherein the logic circuit comprises a first and a second logic gate; and a plurality of delay elements coupled to the logic circuit and adapted to provide the data signals as a second and third complementary data signal based on the first complementary data signal.

* * * * *